US009660622B2

United States Patent
Kim et al.

(10) Patent No.: US 9,660,622 B2
(45) Date of Patent: May 23, 2017

(54) METHOD AND APPARATUS FOR CONTROLLING THRESHOLD VOLTAGE

(71) Applicant: SAMSUNG ELECTRONICS CO., LTD., Suwon-si (KR)

(72) Inventors: Sung Ho Kim, Yongin-si (KR); Junseok Kim, Hwaseong-si (KR); Yunjae Suh, Suwon-si (KR); Eric Hyunsurk Ryu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/001,430

(22) Filed: Jan. 20, 2016

(65) Prior Publication Data

US 2017/0033777 A1 Feb. 2, 2017

(30) Foreign Application Priority Data

Jul. 31, 2015 (KR) .................. 10-2015-0108755

(51) Int. Cl.
*H03K 5/153* (2006.01)
*H03K 5/08* (2006.01)
*H03K 5/24* (2006.01)
*G01J 1/44* (2006.01)
(Continued)

(52) U.S. Cl.
CPC ............ *H03K 5/082* (2013.01); *G01J 1/4204* (2013.01); *G01J 1/44* (2013.01); *G01J 1/46* (2013.01); *H03K 5/24* (2013.01); *G01J 2001/444* (2013.01)

(58) Field of Classification Search
USPC .............................. 327/68, 70, 72, 77, 80–81
See application file for complete search history.

(56) References Cited

U.S. PATENT DOCUMENTS 5,519,548 A * 5/1996 Liepe .................. G11B 5/5534
360/46
6,094,441 A 7/2000 Jung et al.
(Continued)

FOREIGN PATENT DOCUMENTS

KR 10-2005-0044313 A 5/2005
KR 10-2008-0026569 A 3/2008
KR 10-2013-0011543 A 1/2013
(Continued)

OTHER PUBLICATIONS

Patrick Lichtsteiner et al., "A 128×128 120 dB 15 μs Latency Asynchronous Temporal Contrast Vision Sensor", IEEE Journal of Solid-State Circuits, vol. 43, No. 2, Feb. 2008, pp. 566-576.
(Continued)

*Primary Examiner* — An Luu
(74) *Attorney, Agent, or Firm* — Sughrue Mion, PLLC (57) ABSTRACT

A method and an apparatus for controlling a threshold voltage are provided. The method includes receiving noise event signals from a sensing core, the sensing core sensing a portion of a moving object, and generating an event signal. The method further includes determining a type of the noise event signals, determining a number of the noise event signals based on the type of the noise event signals, determining whether the number of the noise event signals satisfies a condition, and controlling a threshold voltage value corresponding to the noise event signals in response to the determining that the number of the noise event signals does not satisfy the condition.

20 Claims, 4 Drawing Sheets

(51) Int. Cl.
*G01J 1/42* (2006.01)
*G01J 1/46* (2006.01)

(56) References Cited

U.S. PATENT DOCUMENTS

2008/0135731 A1   6/2008  Lichtsteiner et al.
2008/0303671 A1  12/2008  Dinh et al.

FOREIGN PATENT DOCUMENTS

KR   10-2013-0040517 A   4/2013
WO     2008/119107 A1  10/2008

OTHER PUBLICATIONS

Minhao Yang et al., "Addressable Current Reference Array with 170dB Dynamic Range", IEEE, 2012, pp. 3110-3113.
J. A. Leñero-Bardallo et al., "A 3.6us Latency Asynchronous Frame-Free Event-Driven Dynamic-Vision-Sensor", IEEE Journal of Solid-State Circuits, vol. XX, No. X, XXX, pp. 1-27.

\* cited by examiner

METHOD AND APPARATUS FOR CONTROLLING THRESHOLD VOLTAGE

CROSS-REFERENCE TO RELATED APPLICATION

This application claims priority from Korean Patent Application No. 10-2015-0108755, filed on Jul. 31, 2015 in the Korean Intellectual Property Office, the disclosure of which is incorporated herein by reference in its entirety.

BACKGROUND

1. Field

Methods and apparatuses consistent with exemplary embodiments relate to a method and an apparatus for controlling a threshold voltage.

2. Description of the Related Art

Recently, due to popularization of smartphones, an event-based vision sensor capable of operating with low calculation and low power consumption in comparison to a frame-based vision sensor is increasingly utilized. In the frame-based vision sensor, signals are output from all sensing elements every frame, whereas in the event-based vision sensor, a signal is output from a sensing element in which an intensity of light changes. Accordingly, in the event-based vision sensor, calculation and power consumption may be reduced.

However, the event-based vision sensor may use a threshold voltage to sense a change in an intensity of light and to output a signal. Due to a limitation in manufacturing of event-based vision sensors, ideal threshold voltages may be different from each other even though the same manufacturing process are used to manufacture event-based vision sensors.

When the same threshold voltage is applied to all a plurality of event-based vision sensors manufactured by the same manufacturing process, it may be difficult to correct an optimum performance of the event-based vision sensors. In addition, there is a limitation to a method of manually determining an ideal threshold voltage of an event-based vision sensor.

SUMMARY

Exemplary embodiments may address at least the above problems and/or disadvantages and other disadvantages not described above. Also, the exemplary embodiments are not required to overcome the disadvantages described above, and may not overcome any of the problems described above.

According to an aspect of an exemplary embodiment, there is provided a threshold voltage control method including receiving noise event signals from a sensing core, the sensing core sensing a portion of a moving object, and generating an event signal. The threshold voltage control method further includes determining a type of the noise event signals, determining a number of the noise event signals based on the type of the noise event signals, determining whether the number of the noise event signals satisfies a condition, and controlling a threshold voltage value corresponding to the noise event signals in response to the determining that the number of the noise event signals does not satisfy the condition.

The noise event signals may be output from the sensing core on which light having a constant intensity is incident.

The determining the type may include determining each of the noise event signals as either an ON event signal or an OFF event signal.

The determining the number of the noise event signals may include determining a number of ON event signals among the noise event signals, and determining a number of OFF event signals among the noise event signals.

The controlling may include increasing or decreasing the threshold voltage value by a value based on a type of a transistor included in the sensing core.

The condition may include at least one among an allowable number of noise event signals in a period of time, and a ratio between a number of ON event signals and a number of OFF event signals among the noise event signals.

The sensing core may generate the ON event signals in response to the sensing core determining that an amount of an increase in an intensity of light incident on the sensing core is greater than a first threshold variation, and the sensing core may generate the OFF event signals in response to the sensing core determining that an amount of a decrease in the intensity of the light incident on the sensing core is greater than a second threshold variation.

The threshold voltage control method may further include transmitting the threshold voltage value to a bias generator, the bias generator generating a threshold voltage based on the threshold voltage value, and providing the threshold voltage to the sensing core.

The sensing core may generate an event signal based on an operating point that is determined based on the threshold voltage value.

The receiving, the determining the type, the determining the number of the noise event signals, the determining whether the number of the noise event signals satisfies the condition, and the controlling may be repeatedly performed until the number of the noise event signals satisfies the condition.

The threshold voltage control method may further include storing the threshold voltage value in a bias generator in response to the determining that the number of the noise event signals satisfies the condition, the bias generator providing the threshold voltage to the sensing core.

The sensing core may be included in an event-based vision sensor generating an event signal in response to an event in which light that is received from the object asynchronously changes.

A non-transitory computer-readable storage medium may store a program for causing a processor to perform the method.

According to an aspect of another exemplary embodiment, there is provided a threshold voltage control apparatus including a communicator configured to receive noise event signals from a sensing core, the sensing core sensing a portion of a moving object and generating an event signal. The threshold voltage control apparatus further includes a controller configured to determine a type of the noise event signals, determine a number of the noise event signals based on the type of the noise event signals, determine whether the number of the noise event signals satisfies a condition, and control a threshold voltage value corresponding to the noise event signals in response to the controller determining that the number of the noise event signals does not satisfy the condition.

The controller may be further configured to determine each of the noise event signals as either an ON event signal or an OFF event signal.

The controller may be further configured to determine a number of ON event signals among the noise event signals, and determine a number of OFF event signals among the noise event signals.

The controller may be further configured to increase or decrease the threshold voltage value by a value based on a type of a transistor included in the sensing core.

The condition may include at least one among: an allowable number of noise event signals in a period of time; and a ratio between a number of ON event signals and a number of OFF event signals among the noise event signals.

The sensing core may be configured to generate an event signal based on an operating point that is determined based on the threshold voltage value.

BRIEF DESCRIPTION OF THE DRAWINGS

The above and/or other aspects will be more apparent by describing exemplary embodiments with reference to the accompanying drawings, in which.

DETAILED DESCRIPTION

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

It will be understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

Figure 1:
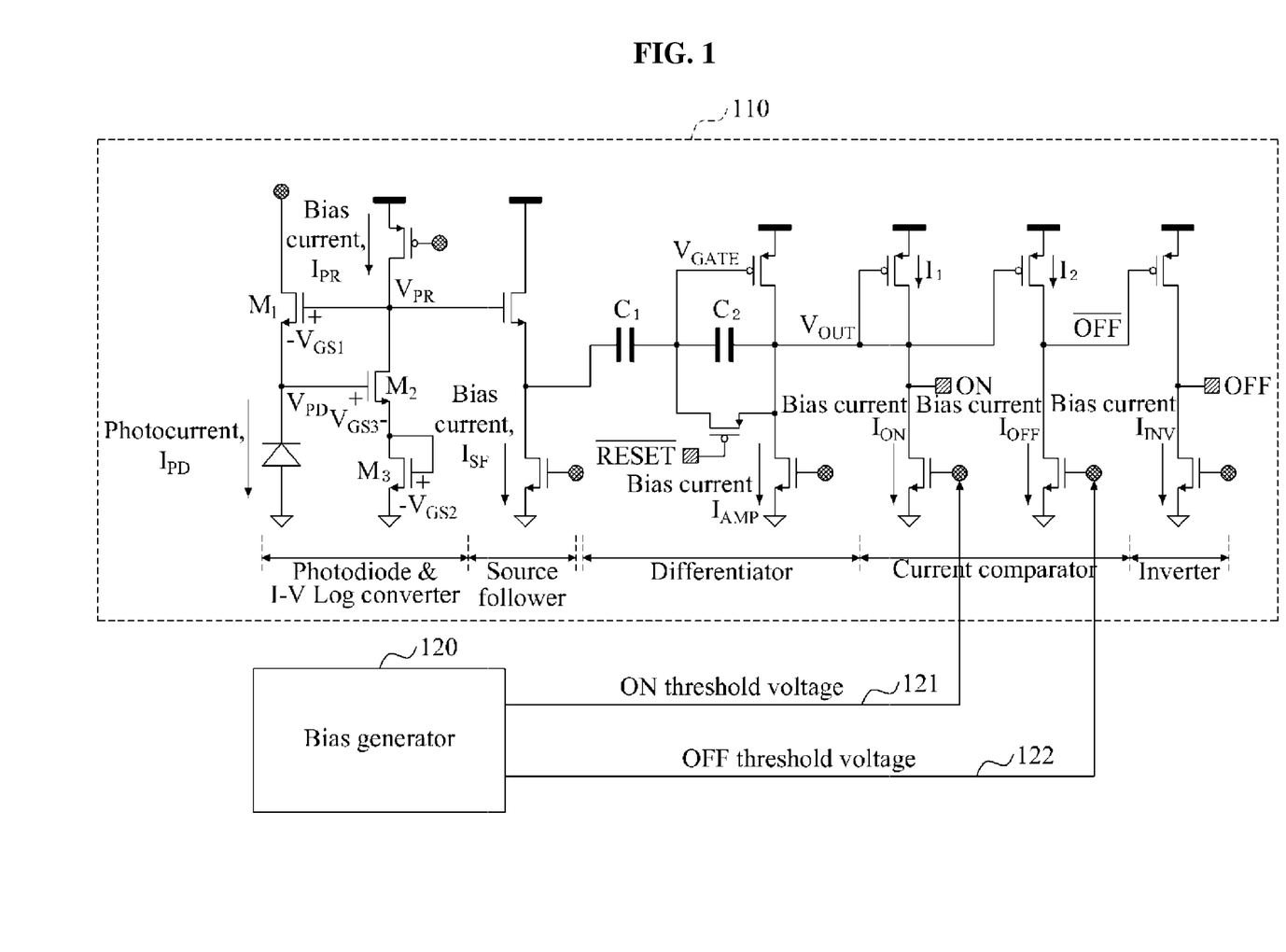
FIG. 1 is a diagram illustrating a process in which a sensing core operates based on a threshold voltage according to an exemplary embodiment.

FIG. 1 is a diagram illustrating a process in which a sensing core operates based on a threshold voltage according to an exemplary embodiment.

Prior to describing a threshold voltage control apparatus according to an exemplary embodiment, a sensing core operating based on a threshold voltage controlled by the threshold voltage control apparatus is briefly described with reference to FIG. 1. The sensing core may be a device included in an event-based vision sensor and may include a plurality of sensing elements.

FIG. 1 illustrates an operation in which a sensing element 110 included in the sensing core generates an event signal based on a threshold voltage. The sensing element 110 may sense an occurrence of a predetermined event and may output an event signal. The sensing element 110 includes a single photodiode and a plurality of transistors.

The photodiode in the sensing element 110 may output an electric signal proportional to an intensity of incident light. For example, the photodiode may generate a voltage or current proportional to an intensity of light. In FIG. 1, a current $I_{PD}$ is generated by the photodiode. When the current $I_{PD}$ is generated by the photodiode, a voltage $V_{PR}$ is generated in an I-V log converter.

A source follower transfers the voltage $V_{PR}$ to an input terminal of the capacitor $C_1$. A differentiator removes a direct current (DC) component of the voltage $V_{PR}$, using the capacitor $C_1$ and a capacitor $C_2$, amplifies the voltage $V_{PR}$ based on a ratio between the capacitors $C_1$ and $C_2$, and outputs a voltage $V_{OUT}$. The voltage $V_{OUT}$ may be obtained by amplifying a variation of the voltage $V_{PR}$. A current comparator generates a current $I_1$ based on the voltage $V_{OUT}$ provided to a gate of a P-type transistor. Also, the current comparator generates a current $I_{ON}$ based on an ON threshold voltage 121 provided from a bias generator 120 to a gate of an N-type transistor.

When a value of the current $I_1$ is greater than a value of the current $I_{ON}$, the sensing element 110 outputs an ON event signal. When the value of the current $I_1$ is less than or equal to the value of the current $I_{ON}$, the sensing element 110 does not output the ON event signal.

In addition, the current comparator generates a current $I_2$ based on the voltage $V_{OUT}$ provided to a gate of another P-type transistor. Also, the current comparator generates a current $I_{OFF}$ based on an OFF threshold voltage 122 provided from the bias generator 120 to a gate of another N-type transistor.

When a value of the current $I_2$ is greater than a value of the current $I_{OFF}$, the sensing element 110 outputs an OFF event signal. When the value of the current $I_2$ is less than or equal to the value of the current $I_{OFF}$, the sensing element 110 does not output the OFF event signal.

When an event in which an intensity of light increases is sensed by the sensing element 110, the sensing element 110 may output an ON event signal. For example, when an amount of an increase in the intensity of the light is greater than a first threshold variation, the sensing element 110 may output an ON event signal.

When an event in which an intensity of light decreases is sensed by the sensing element 110, the sensing element 110 may output an OFF event signal. For example, when an amount of a decrease in the intensity of the light is greater than a second threshold variation, the sensing element 110 may output an OFF event signal.

The first threshold variation may be set based on the ON threshold voltage 121. When a value of the ON threshold voltage 121 increases, the first threshold variation may increase. Accordingly, to output the ON event signal, an intensity of light incident on the sensing element 110 may need to further increase.

Similarly, the second threshold variation may be set based on the OFF threshold voltage 122. When a value of the OFF threshold voltage 122 increases, the second threshold variation may increase. Accordingly, to output the OFF event signal, an intensity of light incident on the sensing element 110 may need to further decrease.

Accordingly, by controlling the ON threshold voltage 121 and the OFF threshold voltage 122, the sensing element 110 may adjust a sensitivity of the sensing element 110 to generate an event signal. Also, by independently controlling the ON threshold voltage 121 and the OFF threshold voltage 122, the sensing element 110 may independently adjust a sensitivity of the sensing element 110 to generate an ON event signal and a sensitivity of the sensing element 110 to generate an OFF event signal.

For example, when light having a constant intensity (for example, 500 lux of light) is incident on the sensing element 110, the sensing element 110 may not output an ON event signal or an OFF event signal. However, an ON event signal or an OFF event signal may be generated by the sensing element 110 in an environment in which an intensity of light remains unchanged, due to various noise sources, for example, power supply noise, thermal noise, and a leakage current. The ON event signal and the OFF event signal generated in the above environment may correspond to noise signals generated in the sensing core, and may be referred to as "noise event signals."

Figure 2:
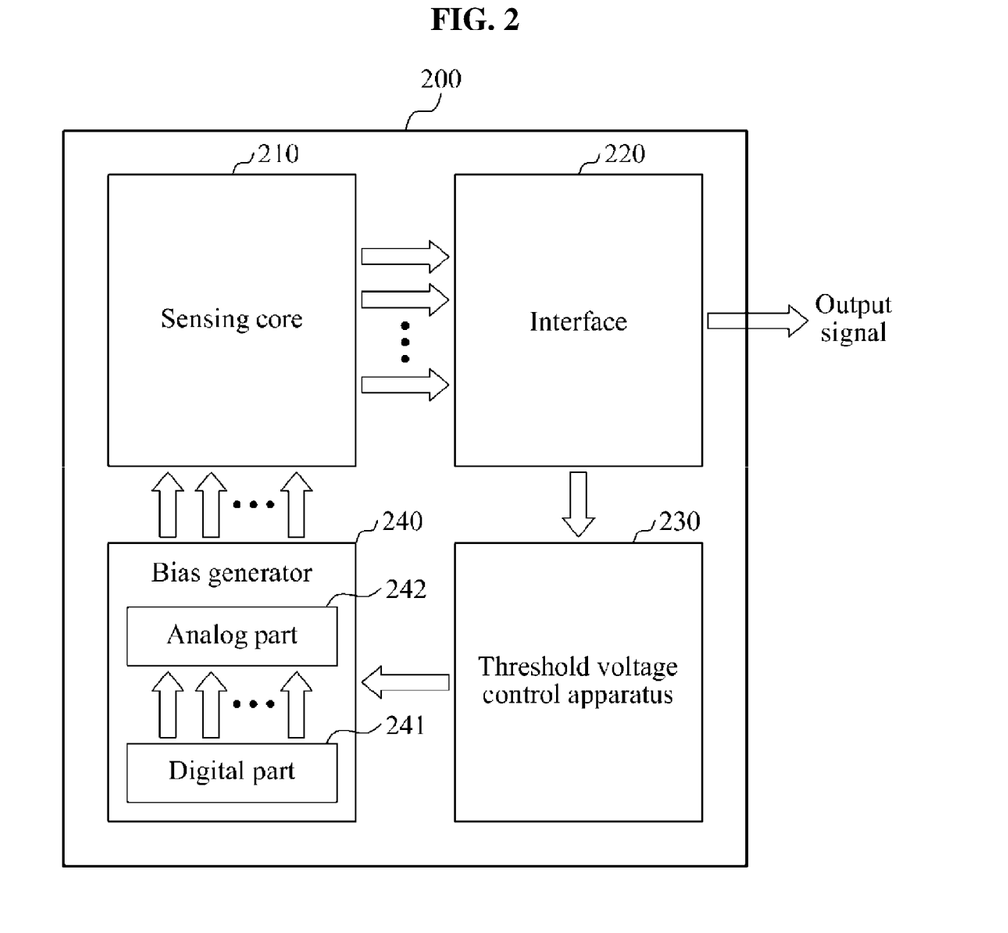
FIG. 2 is a diagram illustrating a threshold voltage control apparatus included in a vision sensor according to an exemplary embodiment.

FIG. 2 is a diagram illustrating a threshold voltage control apparatus 230 included in a vision sensor 200 according to an exemplary embodiment.

Referring to FIG. 2, the vision sensor 200 includes a sensing core 210, an interface 220, the threshold voltage control apparatus 230, and a bias generator 240. The threshold voltage control apparatus 230 may be included as an ON-chip component in the vision sensor 200. For example, the threshold voltage control apparatus 230 may be included as a controller configured to control a threshold voltage of the sensing core 210 in the vision sensor 200.

The vision sensor 200 may be an event-based vision sensor configured to sense at least one portion of a moving object and to output at least one event signal, and may include, for example, a dynamic vision sensor (DVS).

The sensing core 210 may include a plurality of sensing elements, and may be, for example, a DVS core. Unlike a frame-based vision sensor (for example, a complementary metal-oxide semiconductor (CMOS) image sensor (CIS)), the sensing core 210 may generate an event signal, using a sensing element corresponding to a portion in which an intensity of light changes, instead of scanning an output of each of the sensing elements for each frame.

An event signal generated in response to a movement of an object may be, for example, asynchronously generated information, and may be similar to an optic nerve signal transferred from a retina to a brain. For example, an event signal may be generated when a moving object, instead of a stationary object, is sensed.

The sensing core 210 may generate a noise event signal in an environment in which an intensity of incident light remains unchanged, and the noise event signal may be transferred to the interface 220.

The interface 220 may output the noise event signal received from the sensing core 210 as an output signal to an external device. For example, the interface 220 may output a signal including a bit indicating a type of the noise event signal (for example, an ON event signal and an OFF event signal) and an address of a sensing element that generates the noise event signal.

Also, the interface 220 may transfer the noise event signal received from the sensing core 210 to the threshold voltage control apparatus 230.

The threshold voltage control apparatus 230 may receive noise event signals from the sensing core 210 through the interface 220. The noise event signals may refer to event signals output from the sensing core 210 on which light having a constant intensity is incident, and may correspond to random noise.

The threshold voltage control apparatus 230 may determine a type of the noise event signals. The threshold voltage control apparatus 230 may classify each of the received noise event signals as either an ON event signal or an OFF event signal. The threshold voltage control apparatus 230 may determine a type of a noise event signal included in a signal output from the sensing core 210 based on a bit indicating the type of the noise event signal.

The threshold voltage control apparatus 230 may count the noise event signals based on the type. The threshold voltage control apparatus 230 may count ON event signals and OFF event signals among the noise event signals. The threshold voltage control apparatus 230 may count the ON event signals and the OFF event signals among the received noise event signals, and may verify a number of the ON event signals, a number of the OFF event signals, and a ratio between the number of the ON event signals and the number of the OFF event signals.

The threshold voltage control apparatus 230 may determine whether the number of the noise event signals satisfies a predetermined condition. The condition may be set for the noise event signals and may be associated with a performance of the vision sensor 200.

The condition may include at least one among an allowable number of noise event signals and a ratio between a number of ON event signals and a number of OFF event signals among the noise event signals. The allowable number of noise event signals may be set based on a preset period of time, and an allowable number of ON event signals and an allowable number of OFF event signals may be set based on the type of noise event signals.

For example, an allowable number of ON event signals for 1 second and allowable number of OFF event signals for 1 second may be set to "50" and "40," respectively. Also, the ratio between the number of the ON event signals and the number of the OFF event signals may be set to "5:5."

When the number of the noise event signals does not satisfy the condition, the threshold voltage control apparatus 230 may control a threshold voltage value corresponding to the noise event signals. That is, the threshold voltage control apparatus 230 may control a threshold voltage value corresponding to noise event signals that do not satisfy the condition.

In an example, when both a predetermined condition for the number of the ON event signals and a predetermined condition for the number of the OFF event signals are not satisfied, the threshold voltage control apparatus 230 may increase or decrease, by a predetermined value, both an ON threshold voltage value corresponding to an ON event signal and an OFF threshold voltage value corresponding to an OFF event signal. In another example, when a predetermined condition for either the number of the ON event signals or the number of the OFF event signals is not satisfied, the threshold voltage control apparatus 230 may increase or decrease, by a predetermined value, a threshold voltage value corresponding to either the ON event signals or the OFF event signals that do not satisfy the predetermined condition.

When a predetermined condition is not satisfied, the threshold voltage control apparatus 230 may increase or decrease a threshold voltage value by a predetermined value based on a type of a transistor included in the sensing core 210. In an example, when the threshold voltage is provided to an N-type transistor as shown in FIG. 1 and when a number of counted noise event signals is greater than an allowable number of noise event signals as the condition, the threshold voltage control apparatus 230 may increase the threshold voltage value by the predetermined value. In another example, when the threshold voltage is provided to the N-type transistor and when the number of the counted noise event signals is less than the allowable number of the noise event signals, the threshold voltage control apparatus 230 may decrease the threshold voltage value by the predetermined value.

In still another example, when the threshold voltage is provided to a P-type transistor and when the number of the counted noise event signals is greater than the allowable number of the noise event signals, the threshold voltage control apparatus 230 may decrease the threshold voltage value by the predetermined value. In yet another example, when the threshold voltage is provided to the P-type transistor and when the number of the counted noise event signals is less than the allowable number of the noise event signals, the threshold voltage control apparatus 230 may increase the threshold voltage value by the predetermined value.

In a further example, when a ratio between a number of ON event signals and a number of OFF event signals is not satisfied, and when the N-type transistor is used to receive the threshold voltage, the threshold voltage control apparatus 230 may decrease a threshold voltage value corresponding to a smaller number of either the ON event signals or the OFF event signals, by the predetermined value, and may increase a threshold voltage value corresponding to a larger number of either the ON event signals or the OFF event signals, by the predetermined value.

In this example, the controlled threshold voltage value may be increased or decreased by a predetermined ratio, instead of a predetermined value. An example of controlling the threshold voltage value may vary depending on a design.

The threshold voltage control apparatus 230 may transfer the controlled threshold voltage value to the bias generator 240. For example, using a digital stream, the threshold voltage control apparatus 230 may transfer the controlled threshold voltage value to the bias generator 240. The digital stream may include the controlled threshold voltage value as a digital value.

The bias generator 240 may be a device configured to generate a threshold voltage based on the threshold voltage value and to provide the threshold voltage to the sensing core 210. In FIG. 1, the bias generator 240 includes a digital part 241 and an analog part 242.

The digital part 241 may receive the digital stream including the controlled threshold voltage value. The digital part 241 may transfer the threshold voltage value in the digital stream to the analog part 242.

The analog part 242 may generate an analog threshold voltage based on the threshold voltage value. The analog part 242 may generate an ON threshold voltage based on an ON threshold voltage value, and may generate an OFF threshold voltage based on an OFF threshold voltage value. The bias generator 240 may provide the sensing core 210 with the generated OFF threshold voltage and the generated ON threshold voltage.

The OFF threshold voltage and the ON threshold voltage may be used to determine an operating point of the sensing core 210 and to control an operation in which an ON event signal and an OFF event signal are generated in the sensing core 210.

The sensing core 210 may generate noise event signals based on a changed OFF threshold voltage and a changed ON threshold voltage, and may transfer the noise event signals to the threshold voltage control apparatus 230 via the interface 220.

The threshold voltage control apparatus 230 may determine a type of the received noise event signals, may count the noise event signals based on the type, and may determine whether a number of the noise event signals satisfies a predetermined condition.

For example, when the number of the noise event signals does not satisfy the condition, the threshold voltage control apparatus 230 may control a threshold voltage value corresponding to the noise event signals and may transfer the threshold voltage value to the bias generator 240.

The above-described operations may be repeatedly performed until the number of the noise event signals satisfies the condition, and accordingly a threshold voltage suitable for the sensing core 210 may be determined. In other words, until the condition is satisfied, the threshold voltage may be controlled through a loop including the sensing core 210, the interface 220, the threshold voltage control apparatus 230 and the bias generator 240.

For example, when the number of the noise event signals satisfies the condition, the threshold voltage control apparatus 230 may not change the threshold voltage value. The threshold voltage value used in the generation of the noise event signals satisfying the condition may be stored in the bias generator 240. For example, the threshold voltage value may be stored in a memory (for example, a register) included in the bias generator 240. The bias generator 240 may generate a threshold voltage based on the stored threshold voltage value and may provide the threshold voltage to the sensing core 210.

Figure 3:
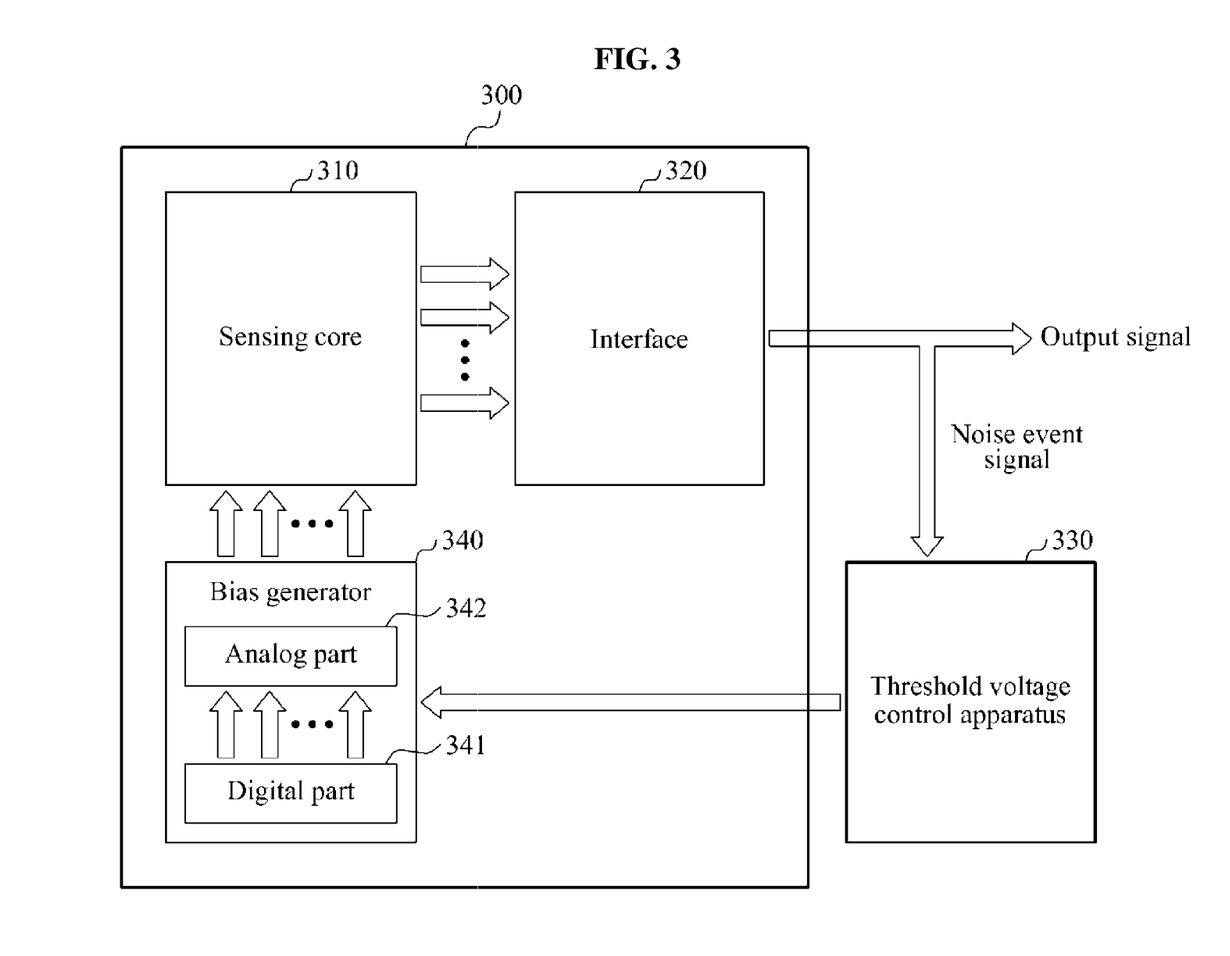
FIG. 3 is a diagram illustrating a threshold voltage control apparatus located outside a vision sensor according to an exemplary embodiment.

FIG. 3 is a diagram illustrating a threshold voltage control apparatus 330 located outside a vision sensor 300 according to an exemplary embodiment.

Referring to FIG. 3, the vision sensor 300 includes a sensing core 310, an interface 320, and a bias generator 340. The threshold voltage control apparatus 330 may be located as an OFF-chip component outside the vision sensor 300. For example, the threshold voltage control apparatus 330 may be implemented or designed using a field programmable gate array (FPGA) or an application processor (AP).

The vision sensor 300 may be an event-based vision sensor configured to sense at least one portion of a moving object and to output at least one event signal, and may include, for example, a DVS.

The sensing core 310 may include a plurality of sensing elements. Unlike a frame-based vision sensor (for example, a CIS), the sensing core 310 may generate an event signal, using a sensing element corresponding to a portion in which an intensity of light changes, instead of scanning an output of each of the sensing elements for each frame.

The sensing core 310 may generate a noise event signal in an environment in which an intensity of incident light remains unchanged, and may transfer the noise event signal to the interface 320.

The interface 320 may output the received noise event signal as an output signal to an external device. For example, the interface 320 may output a signal including a bit indicating a type of the noise event signal (for example, an ON event signal and an OFF event signal) and an address of a sensing element that generates the noise event signal.

The threshold voltage control apparatus 330 may receive noise event signals output through the interface 320.

The threshold voltage control apparatus 330 may determine a type of the noise event signals. The threshold voltage control apparatus 330 may classify each of the received noise event signals as either an ON event signal or an OFF event signal. The noise event signals may refer to ON event signals or OFF event signals generated by the sensing core 310 on which light having a constant intensity is incident, and may correspond to random noise.

The threshold voltage control apparatus 330 may count the noise event signals based on the type. The threshold voltage control apparatus 330 may count ON event signals and OFF event signals among the noise event signals, and may verify a number of the ON event signals, a number of the OFF event signals, and a ratio between the number of the ON event signals and the number of the OFF event signals.

The threshold voltage control apparatus 330 may determine whether the number of the noise event signals satisfies a predetermined condition.

The condition may include at least one among an allowable number of noise event signals and a ratio between a number of ON event signals and a number of OFF event signals among the noise event signals. The allowable number of noise event signals may be set based on a preset period of time, and an allowable number of ON event signals and an allowable number of OFF event signals may be set based on the type of noise event signals.

When the number of the noise event signals does not satisfy the condition, the threshold voltage control apparatus 330 may control a threshold voltage value corresponding to the noise event signals.

In an example, when a predetermined condition is not satisfied, the threshold voltage control apparatus 330 may increase or decrease a threshold voltage value by a predetermined value based on a type of a transistor included in the sensing core 310. For example, when an N-type transistor is used to receive a threshold voltage as shown in FIG. 1 and when a number of counted noise event signals is greater than an allowable number of noise event signals as the condition, the threshold voltage control apparatus 330 may increase the threshold voltage value by the predetermined value. In another example, when the N-type transistor is used to receive the threshold voltage, and when the number of the counted noise event signals is less than the allowable number of the noise event signals, the threshold voltage control apparatus 330 may decrease the threshold voltage value by the predetermined value.

In still another example, when a P-type transistor is used to receive the threshold voltage and when the number of the counted noise event signals is greater than the allowable number of the noise event signals, the threshold voltage control apparatus 330 may decrease the threshold voltage value by the predetermined value. In yet another example, when the P-type transistor is used to receive the threshold voltage and when the number of the counted noise event signals is less than the allowable number of the noise event signals, the threshold voltage control apparatus 330 may increase the threshold voltage value by the predetermined value.

The threshold voltage control apparatus 330 may transfer the controlled threshold voltage value to the bias generator 340 through a digital stream.

The bias generator 340 may be a device configured to generate a threshold voltage based on the threshold voltage value, and to provide the threshold voltage to the sensing core 310. In FIG. 3, the bias generator 340 includes a digital part 341 and an analog part 342. The bias generator 340 may generate an ON threshold voltage based on an ON threshold voltage value, and may generate an OFF threshold voltage based on an OFF threshold voltage value. The bias generator 340 may provide the sensing core 310 with the generated OFF threshold voltage and the generated ON threshold voltage.

An operation of each of the sensing core 310, the interface 320, the threshold voltage control apparatus 330 and the bias generator 340 may be repeatedly performed until the number of the noise event signals satisfies the condition as described with reference to FIG. 2, and thus it is possible to control the threshold voltage.

For example, when the number of the noise event signals satisfies the condition, the threshold voltage control apparatus 330 may not control the threshold voltage value. The threshold voltage value used in the generation of noise event signals satisfying the condition may be stored in the bias generator 340. The bias generator 340 may generate a threshold voltage based on the stored threshold voltage value and may provide the threshold voltage to the sensing core 310.

The description of FIG. 2 is also applicable to the threshold voltage control apparatus 330 except that the threshold voltage control apparatus 330 is located outside the vision sensor 300, and accordingly is not repeated here.

Figure 4:
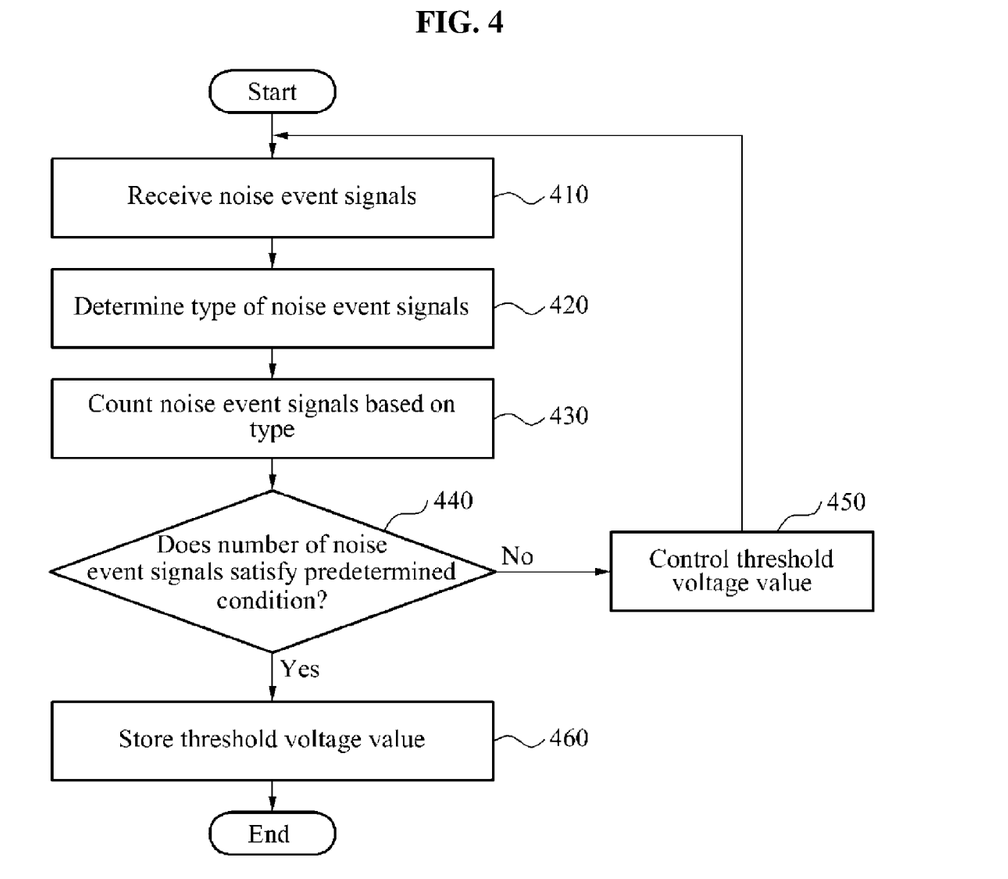
FIG. 4 is a flowchart illustrating a threshold voltage control method according to an exemplary embodiment.

FIG. 4 is a flowchart illustrating a threshold voltage control method according to an exemplary embodiment.

The threshold voltage control method may be performed by a controller or a communicator included in a threshold voltage control apparatus. The threshold voltage control apparatus may be included in a vision sensor or located outside the vision sensor. For example, the threshold voltage control apparatus may be designed as an ON-chip component or an OFF-chip component, using a Verilog that is a hardware description language (HDL), a very high speed integrated circuit (VHSIC) HDL (VHDL), or a synthesis tool.

Referring to FIG. 4, in operation 410, the threshold voltage control apparatus receives noise event signals from a sensing core that is configured to sense at least one portion of a moving object and to generate at least one event signal. For example, the threshold voltage control apparatus may receive noise event signals from the sensing core via an interface included in the vision sensor.

The noise event signals may refer to event signals generated by the sensing core on which light with a constant intensity is incident, and may include ON event signals and OFF event signals. ON event signals may be generated by the sensing core when the sensing core determines that an amount of an increase in an intensity of light incident on the sensing core is greater than a first threshold variation. OFF event signals may be generated by the sensing core when the sensing core determines that an amount of a decrease in the intensity of the light incident on the sensing core is greater than a second threshold variation.

In operation 420, the threshold voltage control apparatus determines a type of the noise event signals.

The threshold voltage control apparatus may determine each of the noise event signals as either an ON event signal or an OFF event signal. For example, the threshold voltage control apparatus may determine a type of a noise event signal based on a bit that indicates the type of the noise event signal and that is included in a signal output from the sensing core.

In operation 430, the threshold voltage control apparatus counts the noise event signals based on the type.

The threshold voltage control apparatus may count ON event signals and OFF event signals among the noise event signals. The threshold voltage control apparatus may classify the received noise event signals as ON event signals and OFF event signals, may calculate a number of the ON event signals and a number of the OFF event signals, and may verify the number of the ON event signals, the number of the OFF event signals, and a ratio between the number of the ON event signals and the number of the OFF event signals.

In operation 440, the threshold voltage control apparatus determines whether a number of the noise event signals satisfies a predetermined condition. The condition may be set for the noise event signals, and may be associated with a performance of the vision sensor.

The condition may include at least one among an allowable number of noise event signals and a ratio between a number of ON event signals and a number of OFF event signals among the noise event signals. The allowable number of noise event signals may be set based on a preset period of time, and an allowable number of ON event signals and an allowable number of OFF event signals may be set based on the type of noise event signals.

For example, an allowable number of ON event signals for 1 second and allowable number of OFF event signals for 1 second may be set to "50" and "40," respectively. Also, the ratio between the number of the ON event signals and the number of the OFF event signals may be set to "5:5."

When the number of the noise event signals does not satisfy the condition, in operation 450, the threshold voltage control apparatus controls a threshold voltage value corresponding to the noise event signals, and returns to operation 410. For example, the threshold voltage control apparatus may control a threshold voltage value corresponding to at least one noise event signal that does not satisfy the condition among the ON event signals and the OFF event signals.

The threshold voltage control apparatus may increase or decrease a threshold voltage value by a predetermined value based on a type of a transistor included in the sensing core. In an example, when an N-type transistor is used to receive a threshold voltage and when a number of counted noise event signals is greater than an allowable number of noise event signals as the condition, the threshold voltage control apparatus may increase the threshold voltage value by the predetermined value. In another example, when the N-type transistor is used to receive the threshold voltage and when the number of the counted noise event signals is less than the allowable number of the noise event signals, the threshold voltage control apparatus may decrease the threshold voltage value by the predetermined value.

In still another example, when a P-type transistor is used to receive the threshold voltage and when the number of the counted noise event signals is greater than the allowable number of the noise event signals, the threshold voltage control apparatus may decrease the threshold voltage value by the predetermined value. In yet another example, when the P-type transistor is used to receive the threshold voltage and when the number of the counted noise event signals is less than the allowable number of the noise event signals, the threshold voltage control apparatus may increase the threshold voltage value by the predetermined value.

The controlled threshold voltage value may be increased or decreased by a predetermined ratio, instead of a predetermined value. An example of controlling the threshold voltage value may vary depending on a design.

The threshold voltage control apparatus may transfer the controlled threshold voltage value to a bias generator. The bias generator may provide an analog threshold voltage generated based on the threshold voltage value to the sensing core. The sensing core may generate an event signal based on an operating point changed based on a threshold voltage.

Operations 410 through 450 may be repeatedly performed until the number of the noise event signals satisfies the condition, and accordingly an ON threshold voltage and an OFF threshold voltage suitable for the sensing core may be determined.

When the number of the noise event signals satisfies the condition, in operation 460, the threshold voltage control apparatus stores, in the bias generator, a threshold voltage value used in the generation of the noise event signals satisfying the condition, by transferring a signal indicating satisfaction of the condition to the bias generator. The bias generator may provide the sensing core with a threshold voltage generated based on the stored threshold voltage value.

The above description of FIGS. 1 through 3 is also applicable to the threshold voltage control method of FIG. 4, and accordingly is not repeated herein.

According to exemplary embodiments, a threshold voltage value may be controlled based on whether a number of noise event signals satisfies a predetermined condition, and thus it is possible to reduce a number of noise event signals generated by a sensing core and to effectively enhance a performance of the sensing core.

In addition, according to exemplary embodiments, a value of a threshold voltage provided to a predetermined sensing core may be controlled based on a number of noise event signals generated by the sensing core, and thus it is possible to automatically determine a threshold voltage optimized for the sensing core.

Moreover, according to exemplary embodiments, noise event signals may be counted based on a type of the noise event signals, and a threshold voltage value may be controlled. Thus, it is possible to determine an optimum ON threshold voltage corresponding to an ON event signal and an optimum OFF threshold voltage corresponding to an OFF event signal.

Furthermore, according to exemplary embodiments, a threshold voltage may continue to be controlled until a number of noise event signals satisfies a predetermined condition, and thus it is possible to determine a threshold voltage optimized for a sensing core.

In addition, according to exemplary embodiments, a threshold voltage control apparatus may be designed to be located outside a vision sensor, and thus it is possible to control a threshold voltage used in the vision sensor while using the vision sensor without a change.

In addition, the exemplary embodiments may also be implemented through computer-readable code and/or instructions on a medium, e.g., a computer-readable medium, to control at least one processing element to implement any above-described embodiments. The medium may correspond to any medium or media that may serve as a storage and/or perform transmission of the computer-readable code.

The computer-readable code may be recorded and/or transferred on a medium in a variety of ways, and examples of the medium include recording media, such as magnetic storage media (e.g., ROM, floppy disks, hard disks, etc.) and optical recording media (e.g., compact disc read only memories (CD-ROMs) or digital versatile discs (DVDs)), and transmission media such as Internet transmission media. Thus, the medium may have a structure suitable for storing or carrying a signal or information, such as a device carrying a bitstream according to one or more exemplary embodiments. The medium may also be on a distributed network, so that the computer-readable code is stored and/or transferred on the medium and executed in a distributed fashion. Furthermore, the processing element may include a processor or a computer processor, and the processing element may be distributed and/or included in a single device.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A threshold voltage control method comprising:
   receiving noise event signals from a sensing core, the sensing core sensing a portion of a moving object, and generating an event signal;
   determining a type of the noise event signals;
   determining a number of the noise event signals based on the type of the noise event signals;
   determining whether the number of the noise event signals satisfies a condition; and
   controlling a threshold voltage value corresponding to the noise event signals in response to the determining that the number of the noise event signals does not satisfy the condition.

2. The threshold voltage control method of claim 1, wherein the noise event signals are output from the sensing core on which light having a constant intensity is incident.

3. The threshold voltage control method of claim 1, wherein the determining the type of the noise event signals comprises determining each of the noise event signals as either an ON event signal or an OFF event signal.

4. The threshold voltage control method of claim 1, wherein the determining the number of the noise event signals comprises:
   determining a number of ON event signals among the noise event signals; and
   determining a number of OFF event signals among the noise event signals.

5. The threshold voltage control method of claim 1, wherein the controlling the threshold voltage value comprises increasing or decreasing the threshold voltage value by a value based on a type of a transistor included in the sensing core.

6. The threshold voltage control method of claim 1, wherein the condition comprises at least one among:
   an allowable number of noise event signals in a period of time; and
   a ratio between a number of ON event signals and a number of OFF event signals among the noise event signals.

7. The threshold voltage control method of claim 6, wherein the sensing core generates the ON event signals in response to the sensing core determining that an amount of an increase in an intensity of light incident on the sensing core is greater than a first threshold variation, and
   the sensing core generates the OFF event signals in response to the sensing core determining that an amount of a decrease in the intensity of the light incident on the sensing core is greater than a second threshold variation.

8. The threshold voltage control method of claim 1, further comprising transmitting the threshold voltage value to a bias generator, the bias generator generating a threshold voltage based on the threshold voltage value, and providing the threshold voltage to the sensing core.

9. The threshold voltage control method of claim 1, wherein the sensing core generates an event signal based on an operating point that is determined based on the threshold voltage value.

10. The threshold voltage control method of claim 1, wherein the receiving the noise event signals, the determining the type of the noise event signals, the determining the number of the noise event signals, the determining whether the number of the noise event signals satisfies the condition, and the controlling the threshold voltage value are repeatedly performed until it is determined that the number of the noise event signals satisfies the condition.

11. The threshold voltage control method of claim 1, further comprising storing the threshold voltage value in a bias generator in response to the determining that the number of the noise event signals satisfies the condition, the bias generator providing the threshold voltage to the sensing core.

12. The threshold voltage control method of claim 1, wherein the sensing core is included in an event-based vision sensor generating an event signal in response to an event in which light that is received from the object asynchronously changes.

13. A non-transitory computer-readable storage medium storing a program which is executable by a processor to perform the method of claim 1.

14. A threshold voltage control apparatus comprising:
   a communicator configured to receive noise event signals from a sensing core, the sensing core being configured to sense a portion of a moving object and to generate an event signal; and
   a controller configured to:
      determine a type of the noise event signals;
      determine a number of the noise event signals based on the type of the noise event signals;
      determine whether the number of the noise event signals satisfies a condition; and
      control a threshold voltage value corresponding to the noise event signals in response to the controller determining that the number of the noise event signals does not satisfy the condition.

15. The threshold voltage control apparatus of claim 14, wherein the noise event signals are output from the sensing core on which light having a constant intensity is incident.

16. The threshold voltage control apparatus of claim 14, wherein the controller is further configured to determine each of the noise event signals as either an ON event signal or an OFF event signal.

17. The threshold voltage control apparatus of claim 14, wherein the controller is further configured to:
   determine a number of ON event signals among the noise event signals; and
   determine a number of OFF event signals among the noise event signals.

18. The threshold voltage control apparatus of claim 14, wherein the controller is further configured to increase or decrease the threshold voltage value by a value based on a type of a transistor included in the sensing core.

19. The threshold voltage control apparatus of claim 14, wherein the condition comprises at least one among:
   an allowable number of noise event signals in a period of time; and
   a ratio between a number of ON event signals and a number of OFF event signals among the noise event signals.

20. The threshold voltage control apparatus of claim 14, wherein the sensing core is configured to generate an event signal based on an operating point that is determined based on the threshold voltage value.

* * * * *